METHOD OF FORMING DIELECTRICALLY ISOLATED SILICON DIODE ARRAY VIDICON TARGET

Filed Aug. 31, 1972 3 Sheets-Sheet 1

United States Patent Office 3,810,796
Patented May 14, 1974

3,810,796
METHOD OF FORMING DIELECTRICALLY ISOLATED SILICON DIODE ARRAY VIDICON TARGET

Frank L. Skaggs and Victor Harrap, Dallas, and Kenneth E. Bean, Richardson, Tex., assignors to Texas Instruments Incorporated, Dallas, Tex.
Filed Aug. 31, 1972, Ser. No. 285,156
Int. Cl. H01l 7/50
U.S. Cl. 156—8 12 Claims

ABSTRACT OF THE DISCLOSURE

The disclosure relates to a dielectrically isolated silicon diode array vidicon target which substantially eliminates the lateral diffusion spread of photo carriers, thereby providing a non-blooming camera pickup tube.

The invention relates to a silicon diode array for use as a camera pickup tube target and, more specifically, to a method of dielectrically isolating the diodes of a silicon diode array to substantially eliminate blooming caused by lateral diffusion or spreading of photo-carriers.

In the low light level television area, when viewing a scene which has very low average illumination level, and when there is a point source of light of greater intensity, a saturation is created in the image plane in the sensor itself which produces an effect called blooming where the localized high intensity point actually grows in size much larger than its actual proportional size. It can grow to the point where it obscures much of the imagery or the information which is being observed. In accordance with the present invention, there is provided a substantially complete solution to the blooming problem. Basically, it has been noted that in the type of image tubes that are presently being produced, namely silicon intensified tubes (SIT) where a silicon slice is used as a sensor, the main problem occurs due to lateral diffusion of the charge within the bulk of the electron sensing material. In the case of n-type silicon it would be holes that are diffusing. It is necessary to restrict the diffusion of the holes or carriers so that they do not move parallel to the surface plane of the electron sensor.

Briefly, in accordance with the present invention, dielectric walls are embedded into the bulk of the sensor. This is provided by one photolithography step.

This invention provides a silicon diode array camera tube target which is substantially free of inversion spread due to intense localized light spots or electron spots.

It is a further object of this invention to provide a silicon diode array for camera pickup tube targets which is relatively free of blooming.

It is a further object of this invention to provide a method of forming a silicon diode array which is substantially free of lateral diffusion spread of holes or carriers to substantially eliminate blooming.

The above objects and still further objects of the invention will immediately become apparent to those skilled in the art after consideration of the following preferred embodiments thereof, which are provided by way of example and not by way of limitation, wherein.

Figure 1:
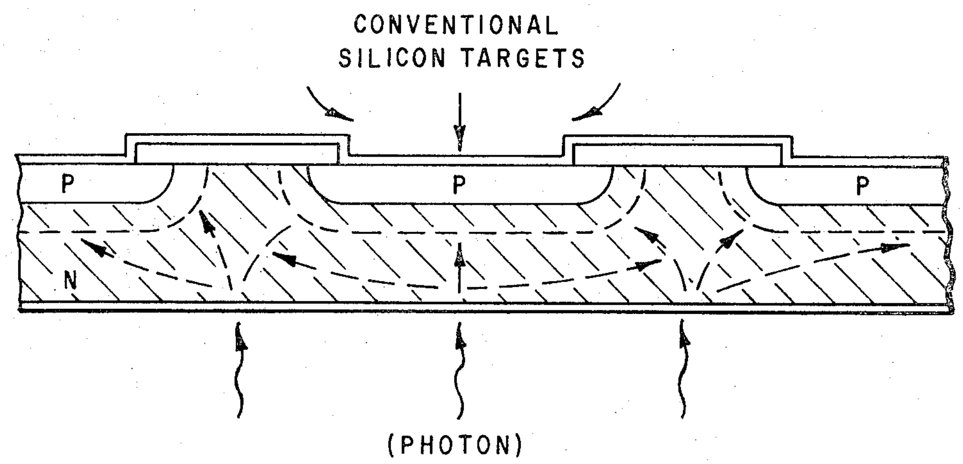
FIG. 1 is an illustration of a conventional silicon target indicating the cause of blooming.

Referring first to FIG. 1, there is shown an illustration of a conventional silicon target wherein the arrows with curved lines illustrate light (or electrons) impinging upon the target. It can be seen that there is lateral diffusion from the n-type region of one of the diodes to the adjacent diodes, this being the cause of blooming in the target. It is such migration of the carriers (or holes, as the case may be) as illustrated in FIG. 1 that it is desired to control.

Figure 2:
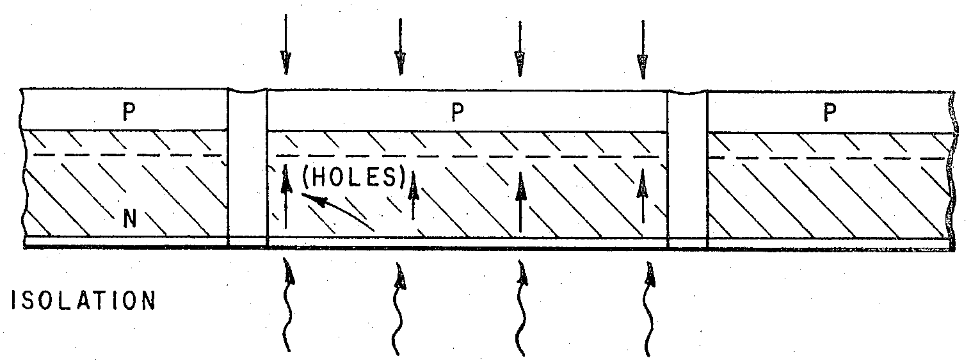
FIG. 2 is an illustration of a preferred embodiment of a silicon target in accordance with the present invention with control of blooming.

Referring now to FIG. 2, there is shown one type of a silicon target wherein the arrows with curved lines again indicate light (or electrons) impinging upon the target. It can now be seen that the carriers in the n-type region that move laterally will be restricted in the lateral movement by the dielectric which is positioned across the pn junctions of the adjacent diodes and extends across the entire length of the diode. For certain types of embodiments, it is not necessary that the dielectric isolating layer extend across the entire length of the n-type region in accordance with the embodiment shown in FIG. 2.

Figures 3A, 3B, 3C, 3D, 3E, 3F, 3G, 3H, 3I:
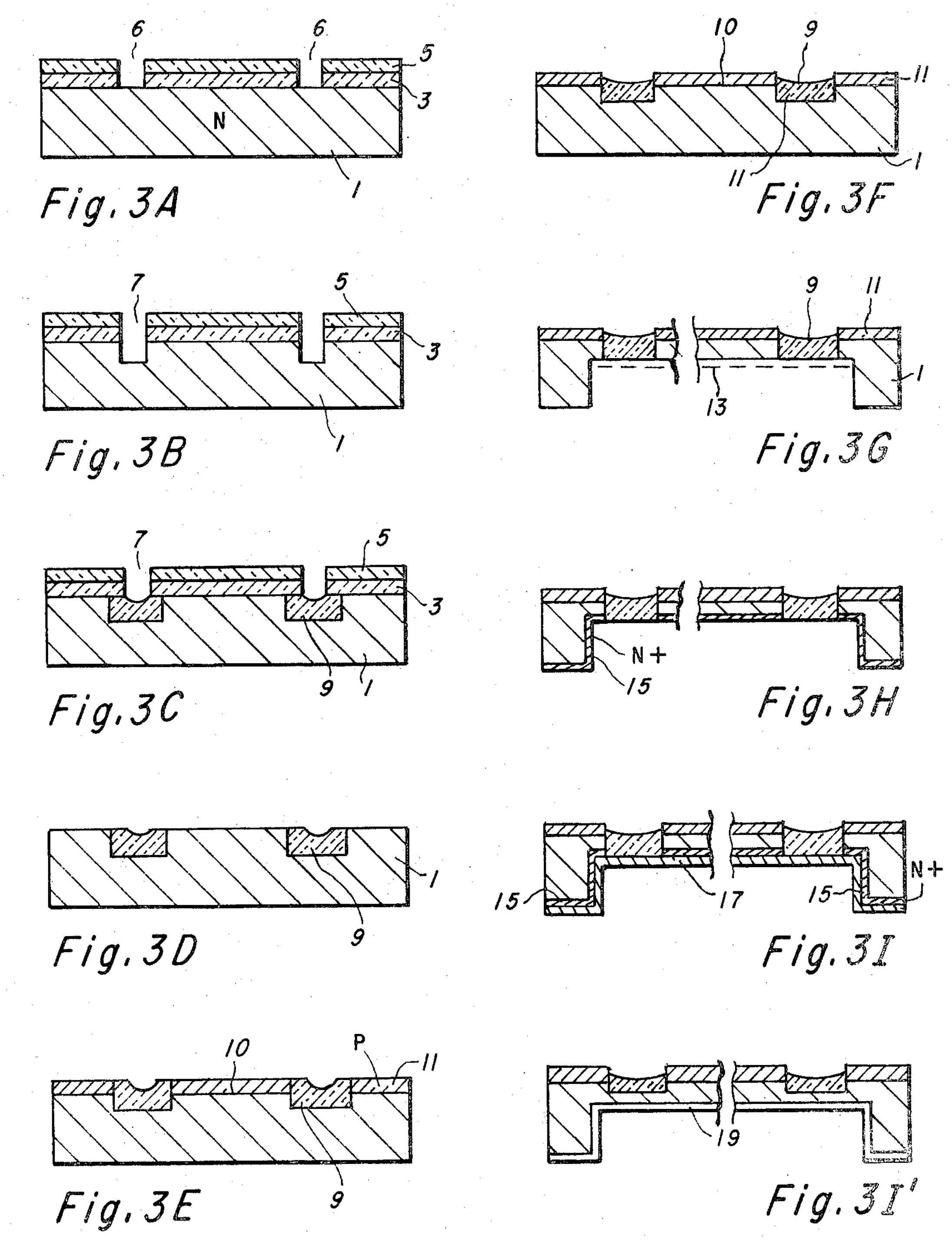
FIG. 3 is an illustration of the steps required in accordance with a first method of providing a dielectrically isolated silicon diode array camera pickup tube target in accordance with the present invention.
Figure 4A:
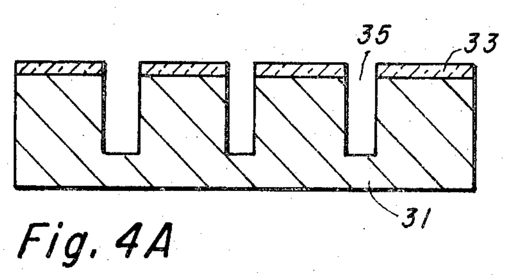
FIG. 4 is an illustration of a second method of providing a dielectrically isolated silicon diode array vidicon target in accordance with the present invention.
Figure 5A:
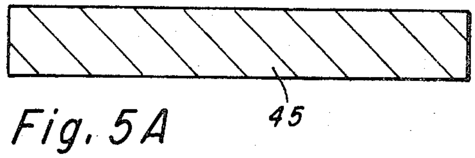
FIG. 5 is a third method of providing a dielectrically isolated silicon diode array vidicon target in accordance with the present invention.
Figure 4B:
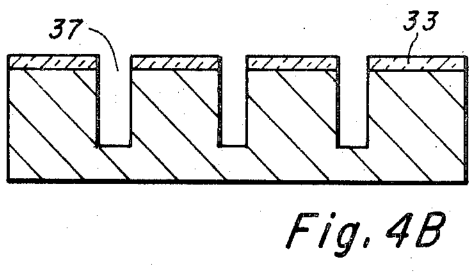
Figure 5B:
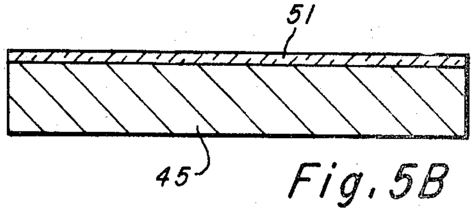
Figure 4C:
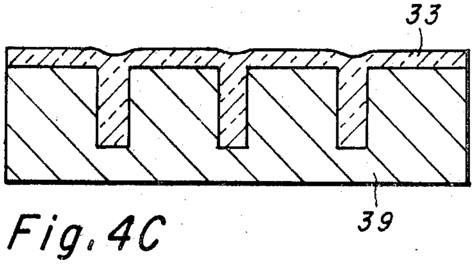
Figure 5C:
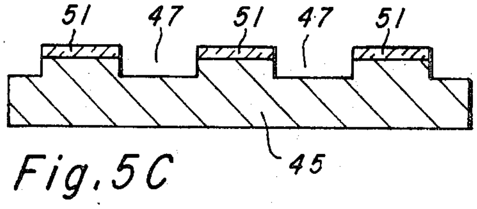
Figure 4D:
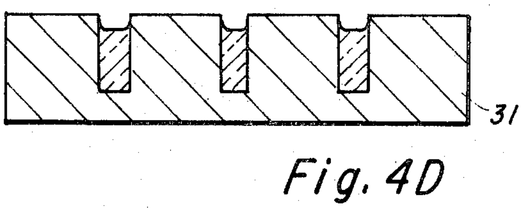
Figure 5D:
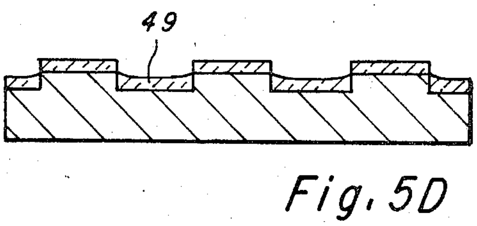
Figure 4E:
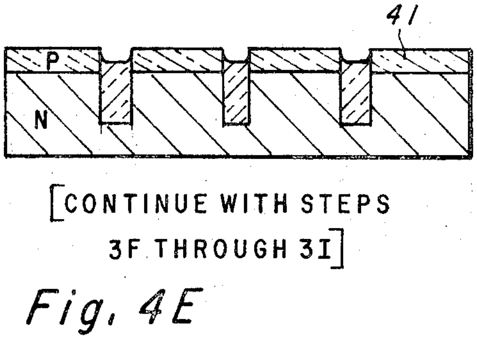
Figure 5E:
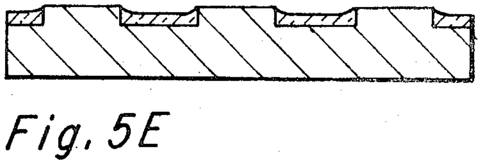

Referring now to FIG. 3A there is shown an n-type silicon chip 1 having a resistivity of preferably 10 ohm-centimeters with a {110} crystal orientation. The silicon has been preferably phosphorus doped though other dopants can be used. A layer of silicon nitride 3 has been placed over the silicon chip by deposition and a layer of silicon dioxide 5 is placed over the silicon nitride layer. Grooves 6 are then etched through the layers 3 and 5 with appropriate etchants, and grooves 7 are then etched into the chip 1 as shown in FIG. 3B using a preferential etch for minimal slot widening, this being a characteristic of {110} material. The chip is then oxidized as shown in FIG. 3C wherein the silicon within the slot becomes oxidized and expands in volume as is well known in the art to substantially fill a portion of the slot as shown in FIG. 3C as 9. The nitride layer 3 and oxide layer 5 are then removed as shown in FIG. 3D, it being understood that the oxide layer 5 could also have been removed prior to oxidation in the prior step. Boron or other similar material is then diffused into the n-type layer 1 to provide a p-type region 11 as shown in FIG. 3E. P-type region 11 could be provided in other ways, and at other stages in the processing sequence. For example, the sequence could begin with a wafer having an epitaxial layer of p-type conductivity on the upper surface. The chip is then deglazed and the oxide 9 in the slots is etched back but not beyond the p-n junction 10. This leaves the junctions passivated. This is shown in FIG. 3F. The rear surface or end region of the chip 1 is then etched back to the oxide material in the slots as shown in FIG. 3G, thereby isolating the diodes from each other. Although, for purposes of illustration, only two diodes are shown, it will be understood by those skilled in the art that as many as one million or more diodes may be fabricated on a single slice, and that the etched rear surface extends across the entire slice, except for the perimeter thereof. In accordance with another version as will be explained later, the silicon is etched back to slightly below the oxide material as shown by the dotted lines 13. An N+ type region 15 is then formed onto the back surface of the silicon such as by doping of phosphorus as shown in FIG. 3H. This reduces recombination at light or electron sensitive surfaces. A thin electron transmissive and electrically conducting film 17, such as a 300 Angstrom layer of aluminum may then be deposited over the N+ region 15 as shown in FIG. 3I. This layer connects to the isolated diodes at the N+ layer rim for external electrical contacting.

A diode array provided in accordance with the above described method substantially completely eliminates inversion layer spreading and lateral hole or carrier diffusion by virtue of complete isolation of each diode.

Referring again to FIG. 3G, if the etch back were to take place to the dotted line shown as 13, a modification is thereby provided which eliminates the requirement of providing the thin electron transmissive conducting film 17 shown in FIG. 3I. In accordance with the second embodiment, an N+ region 19 is formed in the etched back portion of the silicon 1 as shown in FIG. 3I'. The advantages of this second embodiment are that greater sensitivity is provided by virtue that the entire surface is used for generating a signal. Carriers or holes generated under an isolation channel can diffuse to a neighboring diode. Of course, the disadvantages of the second embodiment are the possibility that a very large signal generating a large concentration of mobile holes may result in excessive lateral diffusion of holes, this degrading the anti-blooming performance of the structure. There could be a trade off involved in design in such a structure resulting in an optimum residual target thickness not etched away. In this way, care would have to be taken as to how far back the etch takes place.

Referring now to FIG. 4, there is shown a second method of providing a silicon diode array in accordance with the present invention. Referring first to FIG. 4A, there is shown a silicon chip 31 which is substantially the same as the silicon chip 1 of FIG. 3A, this chip having a layer of grown thermal oxide 33 thereon on which have been defined grooves 35 in well known manner. The chip 31 then has slots 37 etched therein through the grooves 35 defined in the oxide layer as shown in FIG. 4B. The etch takes place, preferably using an orientation dependent etch of well known type. The slots 37 are then filled with silicon oxide, either by depositing the oxide therein or by filling the slots in the manner described with respect to the FIG. 3C to provide the oxide 39 therein. The oxide layer 33 is then removed from the top surface of the chip 31 as shown in FIG. 4D. A p-type region is then diffused into the upper surface of the chip 31 as, for example, by the diffusion of boron therein to form the p-type region 41. It can be seen that the chip as shown in FIG. 4E is substantially identical to the chip shown in FIG. 3E. The remaining steps will be identical to the steps of FIGS. 3F through 3I to provide the final silicon target.

Referring now to FIG. 5, there is shown a third method of making a silicon diode array in accordance with the present invention. FIG. 5A discloses a silicon chip 45 preferably of n-type with 10 ohm-centimeter resistivity and {110} orientation as mentioned above for FIGS. 3 and 4. The slice is lapped and polished and then a layer of silicon nitride 51 is deposited thereon. This is shown in FIG. 5B. The chip is then provided with a suitable masking layer in accordance with known techniques for selectively etching through the nitride and into the silicon as shown in FIG. 5C to provide slots 47. The chip is then oxidized in the manner described above with respect to FIG. 3C to provide an oxide region 49 in the slots. This is shown in FIG. 5D. The nitride of oxynitride which may be formed in the nitride layer is then stripped away without attacking the silicon oxide, by materials such as phosphoric acid or the like, in well known manner. The result of the structure is shown in FIG. 5E which is the same as FIG. 3D. The remaining process steps would be the same as those described with respect to FIGS. 3F through 3I.

When the diodes are totally isolated, they cannot be properly used as direct photon sensor. This is because there is no way to contact the diode array from the back except by metallization or direct wiring. Photon sensing is therefore impossible because of the metal reflection and absorption properties. It is therefore necessary to have only partial isolation as provided in the second embodiment described in conjunction with FIG. 3 for use as a direct photo sensor. As an electron sensor (i.e. impact ionization target), the diodes can be interconnected by the use of a 300 Angstrom aluminum coating on the back which will allow 5,000 to 10,000 electron volt electrons to pass therethrough without any problem.

It is clear that it would be desirable to use a compromise between total isolation and partial isolation, this compromise requiring that the blooming problem still be eliminated or substantially eliminated. A further reason in addition to that set forth above for the desirability of partial isolation is that the final chip is more rigid if the dielectric column does not go all the way through. It can be seen that there has been provided a diode array and a method of making same which substantially eliminates the problem of blooming as known in the prior art.

Though the invention has been described with respect to specific preferred embodiments thereof, many variations and modifications thereof will immediately become apparent to those skilled in the art. It is therefore the intention that the appended claims be interpreted as broadly as possible in view of the prior art to include all such variations and modifications.

What is claimed is:

1. A method of making a semiconductor vidicon target element which comprises the steps of:

(a) providing a single crystal slice of silicon having a 110 crystal orientation and a single pn junction therein substantially parallel to the major surfaces of said slice;

(b) establishing a plurality of isolated regions on one major surface of said slice each of said regions being masked by an etch resistant material;

(c) subjecting the unmasked regions of said surface to an orientation dependent etch for a time sufficient to form slots surrounding each of said plurality of masked regions, said slots extending into the slice to a depth greater than said pn junction and having sides substantially perpendicular to said junction and said surface;

(d) thereafter substantially filling said slots with silicon dioxide.

2. The method as set forth in claim 1 wherein said silicon dioxide is formed by oxidation of the silicon on the sides and bottoms of said slots.

3. The method defined in claim 1 further including the steps of removing material from a portion of the other major surface of said slice to a depth whereby said slots extend completely through said slice and thereafter coating the newly established surface of the element with a thin metallic layer.

4. A method as set forth in claim 1 including the additional steps of removing a portion of the other major surface of said slice to a depth slightly removed from the bottoms of said slots and thereafter establishing an electrically conductive layer at the new surface established by said material removal step.

5. The method as set forth in claim 4 wherein said highly conductive layer is produced by establishing a very low resistivity semiconductor layer of the same conductivity type as said other major surface.

6. A method as set forth in claim 4 wherein said electrically conductive layer is established by applying a metallic coating to the newly established surface of the element.

7. A method of making a semiconductor vidicon target element which comprises the steps of:

(a) providing a single crystal slice of silicon having a 110 crystal orientation;

(b) establishing a plurality of isolated regions on one major surface of said slice each of said regions being masked by an etch resistant material;

(c) subjecting the unmasked regions of said one major surface to an orientation dependent etch for a time sufficient to form slots surrounding each of said plurality of masked regions, said slots having sides substantially perpendicular to said major surface;

(d) substantially filling said slots with silicon dioxide; and (e) thereafter diffusing into said isolated regions an impurity of a kind to produce a conductivity in said silicon opposite that of the conductivity type of the main body of the slice for a time sufficient to form pn junctions in each of said isolated regions, said junctions being coplanar and at a depth less than that of the bottoms of said slots.

8. The method as set forth in claim 7 wherein said silicon dioxide is formed by oxidation of the silicon on the sides and bottoms of said slots.

9. The method defined in claim 7 further including the steps of removing material from a portion of the other major surface of said slice to a depth whereby said slots extend completely through said slice and thereafter coating the newly established surface of the element with a thin metallic layer.

10. A method as set forth in claim 7 including the additional steps of removing a portion of the other major surface of said slice to a depth slightly removed from the bottoms of said slots and thereafter establishing an electrically conductive layer at the new surface established by said material removal step.

11. The method as set forth in claim 10 wherein said highly conductive layer is produced by establishing a very low resistivity semiconductor layer of the same conductivity type as said other major surface.

12. A method as set forth in claim 10 wherein said electrically conductive layer is established by applying a metallic coating to the newly established surface of the element.

References Cited

UNITED STATES PATENTS

| | | | |
|---|---|---|---|
| 3,648,125 | 3/1972 | Peltzer | 317—235 |
| 3,607,466 | 9/1971 | Miyazaki | 148—175 |
| 3,707,657 | 12/1972 | Veith | 317—235 R |
| 3,602,981 | 9/1971 | Kooi | 29—571 |
| 3,386,865 | 6/1968 | Doo | 148—175 |

OTHER REFERENCES

Pieczonka et al., I.B.M. Tech Disd.-Bull., vol. 8, No. 4, September 1965.

WILLIAM A. POWELL, Primary Examiner

U.S. Cl. X.R.

156—11, 17; 317—235